US012764935B2

(12) United States Patent
Liao et al.

(10) Patent No.: US 12,764,935 B2
(45) Date of Patent: Oct. 13, 2026

(54) TRANSISTOR, MANUFACTURING METHOD THEREOF, AND MEMORY

(71) Applicant: CHANGXIN MEMORY TECHNOLOGIES, INC., Hefei City (CN)

(72) Inventors: Chun-Wei Liao, Hefei City (CN); Xiaoguang Wang, Hefei City (CN); Deyuan Xiao, Hefei City (CN); Tzung-Han Lee, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 773 days.

(21) Appl. No.: 18/151,434

(22) Filed: Jan. 7, 2023

(65) Prior Publication Data

US 2023/0389294 A1 Nov. 30, 2023

Related U.S. Application Data

(63) Continuation of application No. PCT/CN2022/106460, filed on Jul. 19, 2022.

(30) Foreign Application Priority Data

May 26, 2022 (CN) ........................ 202210590499.0

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC ..... H10B 12/34; H10B 12/053; H10B 12/488
See application file for complete search history.

(56) References Cited

U.S. PATENT DOCUMENTS

| | | | | |
|---|---|---|---|---|
| 6,744,087 | B2 | 6/2004 | Misewich | |
| 8,461,597 | B2 | 6/2013 | Kim | |
| 8,525,248 | B2 * | 9/2013 | Mouli | H10B 12/10 257/315 |
| 11,145,753 | B2 | 10/2021 | Yu | |
| 11,404,551 | B2 | 8/2022 | Li | |
| 11,631,743 | B2 * | 4/2023 | Yoo | H10D 30/6219 257/382 |
| 12,575,077 | B2 * | 3/2026 | Lee | H10B 12/00 |
| 2004/0061153 | A1 | 4/2004 | Misewich | |

(Continued)

FOREIGN PATENT DOCUMENTS

| | | | |
|---|---|---|---|
| CN | 1490880 | A | 4/2004 |
| CN | 102130177 | A | 7/2011 |

(Continued)

*Primary Examiner* — Sue A Purvis
(74) *Attorney, Agent, or Firm* — Syncoda LLC; Feng Ma

(57) ABSTRACT

A transistor includes: a substrate including an active area; a gate structure penetrating through the active area and including a gate and a gate dielectric layer, in which the gate dielectric layer covers sidewalls and a bottom of the gate; a channel layer located on a side of the gate dielectric layer away from the gate, in which the channel layer includes a metal oxide semiconductor layer, in which the active area includes a first active layer and a second active layer located at two sides of the gate structure, and the first active layer and the second active layer are in contact with the channel layer.

18 Claims, 20 Drawing Sheets

(56) References Cited

U.S. PATENT DOCUMENTS

| | | | | |
|---|---|---|---|---|
| 2009/0315092 | A1 | 12/2009 | Mikasa | |
| 2011/0175080 | A1 | 7/2011 | Kim | |
| 2012/0286270 | A1* | 11/2012 | Isobe | H10D 1/68<br>438/156 |
| 2018/0174845 | A1* | 6/2018 | Jang | H10D 64/513 |
| 2020/0227541 | A1 | 7/2020 | Yu et al. | |
| 2021/0050426 | A1 | 2/2021 | Li | |
| 2022/0238675 | A1 | 7/2022 | Li | |
| 2023/0015580 | A1* | 1/2023 | Xi | H10B 12/053 |
| 2023/0035916 | A1* | 2/2023 | Kim | H10B 12/315 |
| 2023/0050475 | A1* | 2/2023 | Chen | H10D 30/015 |

FOREIGN PATENT DOCUMENTS

| | | | |
|---|---|---|---|
| CN | 103367404 | A | 10/2013 |
| CN | 108511518 | A | 9/2018 |
| CN | 110649098 | A | 1/2020 |
| CN | 110875391 | A | 3/2020 |
| CN | 110896077 | A | 3/2020 |
| CN | 107452810 | B | 10/2020 |

* cited by examiner

TRANSISTOR, MANUFACTURING METHOD THEREOF, AND MEMORY

CROSS-REFERENCE TO RELATED APPLICATIONS

This is a U.S. continuation application of International Application No. PCT/CN2022/106460 filed on Jul. 19, 2022, which claims priority to Chinese Patent Application No. 202210590499.0 filed on May 26, 2022. The disclosures of the above-referenced applications are hereby incorporated by reference in their entirety.

BACKGROUND

A transistor is an important element in an electronic circuit. In the transistor, a gate voltage of a gate is used for controlling a current flowing between a source and a drain and through a channel. The transistor is a voltage-controlled switching device.

The transistor can be used for forming a memory, for example, a dynamic random access memory (DRAM), and the transistor can form a storage unit together with a capacitor. An electrical property of the transistor has an important impact on a storage performance of the storage unit. Therefore, it is an important way to improve the electrical property of the transistor, in order to improve the performance of the storage unit.

SUMMARY

According to a first aspect of the disclosure, a transistor is provided, which includes a substrate, a gate structure and a channel layer.

The substrate includes an active area.

The gate structure penetrates through the active area and includes a gate and a gate dielectric layer. The gate dielectric layer covers sidewalls and a bottom of the gate.

The channel layer is located on a side of the gate dielectric layer away from the gate, and includes a metal oxide semiconductor layer.

Herein, the active area includes a first active layer and a second active layer located at two sides of the gate structure. The first active layer and the second active layer are in contact with the channel layer.

According to a second aspect of the disclosure, a memory is provided, which includes a storage unit.

The storage unit is configured to store data and includes the transistor according to the first aspect of the disclosure.

According to a third aspect of the disclosure, a method for manufacturing a transistor is provided, which includes the following operations.

A substrate is provided, in which the substrate includes an active area, and a trench penetrating through the active area is provided in the substrate.

A first active layer and a second active layer are formed in the active area, in which the first active layer and the second active layer are arranged at two sides of the trench.

A channel layer is formed on a bottom and sidewalls of the trench located at the active area, in which the channel layer includes a metal oxide semiconductor layer and is in contact with the first active layer and the second active layer.

A gate dielectric layer and a gate are formed in sequence in the trench, in which the gate dielectric layer covers the channel layer.

DETAILED DESCRIPTION

Figure 1:
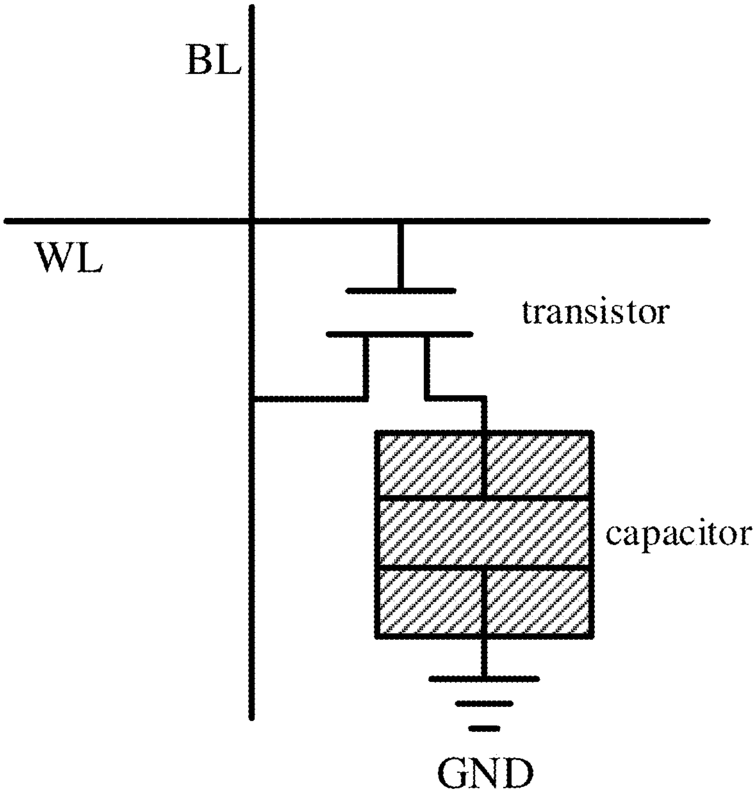
FIG. 1 is a schematic structural diagram of a storage unit of a DRAM provided by embodiments of the disclosure.

The technical solutions of the disclosure will be described in detail below with reference to the accompanying drawings and specific embodiments.

In the description of the disclosure, it should be understood that orientations or positional relationships indicated by the terms “length”, “width”, “depth”, “up”, “down” or “out” are based on the orientations or positional relationships shown in the drawings. They are only used for describing the disclosure in a convenient and simplified way, and are not intended to indicate or imply that the device or element in discussion must have a particular orientation, or must be configured and operated in a particular orientation, and therefore these terms should not be construed as a limitation to the disclosure.

Embodiments of the disclosure are described by taking a storage unit of a DRAM as an example. FIG. 1 is a schematic structural diagram of a storage unit of a DRAM provided by embodiments of the disclosure. Each storage unit of the DRAM includes one transistor and one capacitor, forming a 1T1C structure. A gate of the transistor is connected to a word line (WL), a drain is connected to a bit line (BL), and a source is connected to the capacitor. A voltage signal of the word line can control the transistor to turn on or off, and then the data in the capacitor may be read-out by the bit line, or data may be written into the capacitor for storage by the bit line. In the capacitor, the amount of stored charges is represented by the digit of "1" or "0". Usually, "0" represents a less amount of charges and "1" represents a greater amount of charges, and vice versa.

Figure 2:
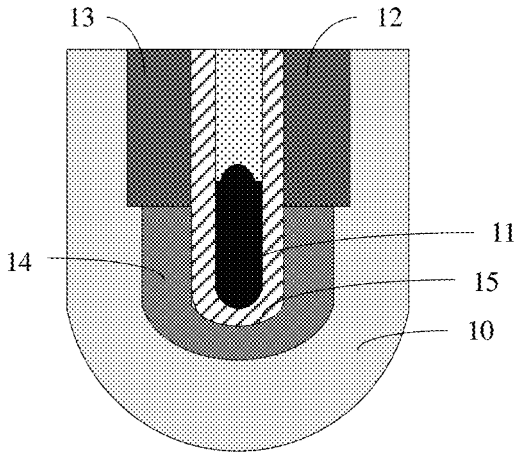
FIG. 2 is a schematic structural diagram of a transistor with a buried word line provided by embodiments of the disclosure.

In order to improve the integration level of the DRAM, a buried word line structure is usually adopted for the transistor in the storage unit of the DRAM. FIG. 2 is a schematic structural diagram of a transistor with a buried word line provided by embodiments of the disclosure. The transistor includes a gate 11 located in a substrate 10, and a source 12 and a drain 13 located at two sides of the gate 10 in the substrate 11. A channel layer 14 is formed by the substrate 10 located between the source 12 and the drain 13. The gate 11 is covered by a gate dielectric layer 15 to isolate the gate 11 from the source 12, the drain 13 and the channel layer 14.

The substrate 10 of the DRAM usually is formed by a conventional silicon semiconductor, such as hydrogenated amorphous silicon α-Si:H, polysilicon or monocrystalline silicon. That is, a material of the channel layer 14 is usually a silicon semiconductor. Due to a low migration rate of carriers in the silicon semiconductor, a switching speed of the transistor is slow, which leads to a low reading or writing speed of the storage unit. In addition, an off-current of the silicon semiconductor is great, a loss rate of carriers stored in the capacitor is great when the transistor is in an off state, which may lead to insufficient charges stored in the capacitor, thereby producing data errors. Therefore, a time interval between two refreshes of the storage unit must be shorten, which leads to a large power consumption of the DRAM.

Figure 3:
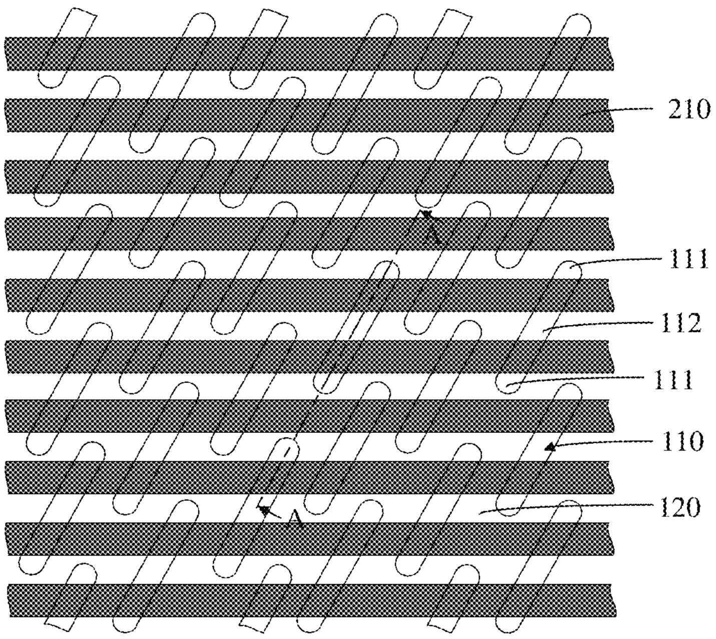
FIG. 3 is a top view of a transistor array provided by embodiments of the disclosure.
Figure 4:
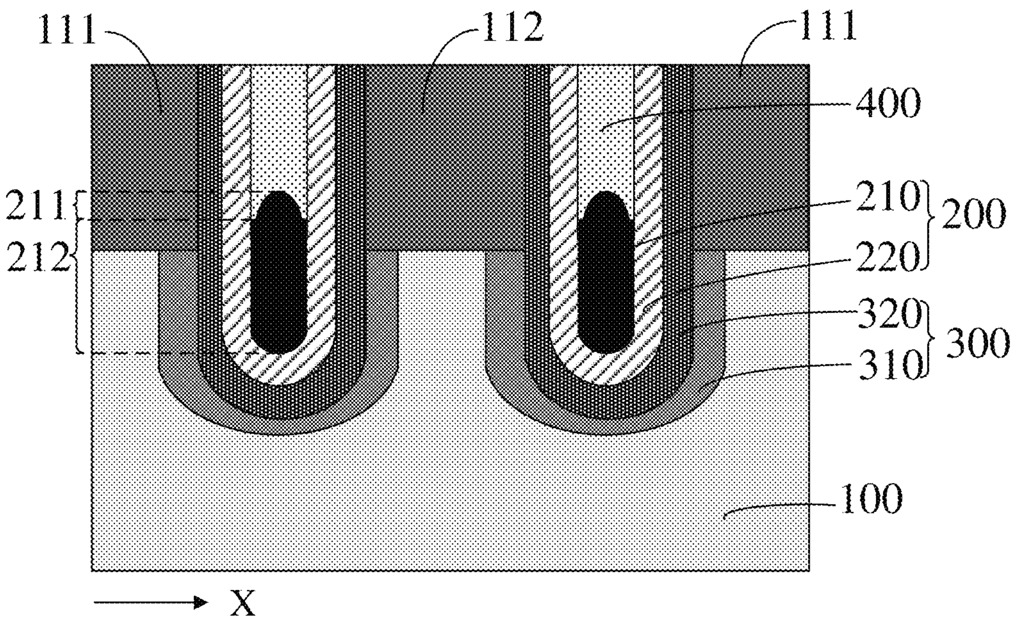
FIG. 4 is a partial sectional view of the transistor array shown in FIG. 3 along the A-A line.

In view of this, embodiments of the disclosure provide a transistor. A channel layer of the transistor has a higher migration rate, and the transistor has a small off-current, which can improve a storage performance of a DRAM. FIG. 3 is a top view of a transistor array provided by embodiments of the disclosure; and FIG. 4 is a partial sectional view of the transistor array shown in FIG. 3 along the A-A line. As shown in FIG. 3 and FIG. 4, the transistor includes: a substrate 100, a gate structure 200 and a channel layer 300.

The substrate 100 includes an active area 110.

The gate structure 200 penetrates through the active area 110 and includes a gate 210 and a gate dielectric layer 220. The gate dielectric layer 220 covers sidewalls and a bottom of the gate 210.

The channel layer 300 is located on a side of the gate dielectric layer 220 away from the gate 210, and includes a metal oxide semiconductor layer.

The active area 110 includes a first active layer 111 and a second active layer 112 located at two sides of the gate structure 200. The first active layer 111 and the second active layer 112 both are in contact with the channel layer 300.

In some embodiments, the substrate 100 is a semiconductor substrate. Specifically, a material of the substrate may be silicon, germanium, silicon germanium semiconductor or silicon carbide, etc., or may be silicon-on-insulator (all) or germanium-on-insulator (GM), or other materials, for example, gallium arsenide or other group III-V compounds. The substrate 100 may also be implanted with a certain amount of doping ions according to design requirements to modify electrical parameters.

Referring to FIG. 3, the substrate 100 includes a plurality of active areas 110 and shallow trench isolation structures 120. The plurality of active areas 110 are arranged in an array, and a shallow trench isolation structure 120 is located between two adjacent active areas 110 to electrically isolate the two adjacent active areas 110.

Exemplarily, each active area 110 may include one or two transistors. In the embodiments, each active area 110 includes two transistors arranged in parallel, and second active layers 112 of the two transistors are in contact and may be connected to the same bit line. A first active layer 111 of a first transistor is connected to a capacitor, and a first active layer 111 of a second transistor can be connected to another capacitor.

One of a first active layer 111 and a second active layer 112 is a source, and the other is a drain. Exemplarily, the first active layer 111 is the source, and the second active layer 112 is the drain, and vice versa.

In some embodiments, the first active layer 111 and the second active layer 112 may be formed by implanting the doping ions into the substrate 100. The first active layer 111 and the second active layer 112 may both be P-type doped regions, or be N-type doped regions.

The doping ions for forming the P-type doped regions may include boron (B), aluminum (Al) or gallium (Ga), etc. The doping ions for forming the N-type doped regions may include phosphorus (P), arsenic (As) or antimony (Sb), etc. Element types of the doping ions of the first active layer 111 and the second active layer 112 may be the same or different. In some embodiments, the element types of the doping ions of the first active layer 111 and the second active layer 112 are the same.

Further referring to FIG. 3, a gate 210 penetrates through a plurality of active areas 110 arranged in parallel, and through shallow trench isolation structures 120 between adjacent active areas 110. By controlling a voltage applied to the gate 210, it is possible to control on or off of a plurality of transistors connected to the gate 210.

In some embodiments, one active area 110 may be penetrated through by two gates 210 arranged in parallel in order to form two transistors in the one active area 110. A first active layer 111 and a second active layer 112 of each transistor are located at two sides of a gate 210.

The material of the gate 210 may include a metal (for example, tantalum, titanium, molybdenum, tungsten, platinum, aluminum, hafnium or ruthenium), a metal silicide (for example, titanium silicide, cobalt silicide, nickel silicide or tantalum silicide), a metal nitride (for example, titanium nitride or tantalum nitride), a doped polysilicon, or other conducting materials.

The material of the gate dielectric layer 220 may include a silicon oxide, a silicon nitride, or other high-K dielectric materials.

The channel layer 300 is located on the side of the gate dielectric layer 220 away from the gate 210, that is, the channel layer 300 and the gate 210 are isolated from each other by the gate dielectric layer 220. The channel layer 300 is in contact with the first active layer 111 and the second active layer 112. When the voltage applied to the gate 210 is greater than a threshold voltage of the transistor, an inversion layer is formed in the channel layer 300 to form a conductive channel, and the transistor is turned on, so that carriers can flow between the first active layer 111 and the second active layer 112.

In the embodiments of the disclosure, the channel layer 300 includes the metal oxide semiconductor layer, that is, the material of the channel layer 300 includes a metal oxide semiconductor.

Figure 5:
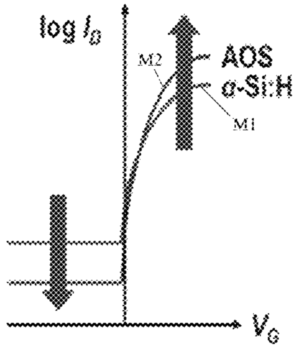
FIG. 5 shows transfer characteristic curves of two transistors provided by embodiments of the disclosure.

FIG. 5 shows transfer characteristic curves of two transistors provided by embodiments of the disclosure. The abscissa is a gate voltage $V_G$ and the ordinate is a logarithm to base 10 of a current $I_D$ between the source and the drain. A channel layer of a transistor M1 is made of hydrogenated amorphous silicon (α-Si:H) and a channel layer of a transistor M2 is made of an amorphous oxide semiconductor (AOS). As shown in FIG. 5, the transistor M2 has a greater on-current and a smaller off-current, and the transistor M2 has a greater on/off current ratio. An on/off current ratio is a ratio of output currents of a transistor in an on state and an off state.

Moreover, when the gate voltage $V_G$ is greater than the threshold voltage, the transfer characteristic curve of the transistor M2 is steeper than that of the transistor M1, that is, the current of the transistor M2 changes faster from an off state to an on state.

The transistor M2 has the above device characteristics, and this is because the channel layer of the transistor M2 includes the metal oxide semiconductor layer. In the metal oxide semiconductor layer, a metal and an oxide are bound by ionic bonds, and a conduction band is formed by an s orbital of the metal, which is spherical and isotropic. Because outer orbital radius of metal atoms is great, s orbitals between adjacent atoms overlap, which provides a path for electron transmission. Therefore, the metal oxide semiconductor layer has a higher migration rate. Furthermore, the material of the metal oxide semiconductor layer includes a number of effective holes, which can also improve the migration rate of electrons. Exemplarily, a migration rate of carriers in the amorphous metal oxide semiconductor layer is about 20 to 50 times that of hydrogenated amorphous silicon.

Due to the higher migration rate of carriers in the metal oxide semiconductor layer, so that the transistor M2 comprising it can have a greater on-current, and the current changes faster from the off state to the on state.

In addition, the metal oxide semiconductor has a wide band gap. Exemplarily, the band gap Eg of the metal oxide semiconductor can be up to 3.1 eV. In the off state, it is difficult for electrons to be excited from a valence band to a conduction band, so the metal oxide semiconductor layer has the smaller off-current.

In the embodiments of the disclosure, the channel layer of the transistor includes the metal oxide semiconductor layer. In the first aspect, the migration rate of carriers in the metal oxide semiconductor layer is higher. When the transistor is in the on state, a migration layer in which carriers have a higher migration rate can be formed in the channel layer, which improves the switching speed of the transistor, thereby improving the reading or writing speed of the storage unit. In the second aspect, the on-current of the transistor with the metal oxide semiconductor layer used is greater, so that a volume of the transistor can be reduced, thereby reducing a volume of the storage unit and improving integration level of the memory. In the third aspect, the off-current of the transistor with the metal oxide semiconductor layer used is smaller. When the transistor is in the off state, the loss rate of the carriers in the capacitor is slow, so that a stability of the storage unit is good. When the loss rate of the carriers in the capacitor is slow, the time interval between two refreshes of the storage unit can be prolonged, thereby reducing the power consumption of the storage unit. In the fourth aspect, the on/off current ratio of the transistor with the metal oxide semiconductor layer used is relatively greater, and the current changes rapidly from the off state to the on state, which can improve the switching speed of the transistor and improving the reading or writing speed of the storage unit. In a word, in the embodiments of the disclosure, when the channel layer includes the metal oxide semiconductor layer, the electrical property of the transistor can be improved. As a result, a storage performance of the storage unit is improved, thereby improving the storage performance and the integration level of memory.

In some embodiments, a material of the metal oxide semiconductor layer includes at least one of indium gallium zinc oxide (InGaZnO or IGZO), indium tin oxide (ITO), indium tungsten oxide (InWO), indium zinc oxide (InZnO), gallium oxide ($GaO_x$) or indium oxide (InOx).

In some embodiments, the material of the channel layer 300 includes indium gallium zinc oxide (IGZO). In indium gallium zinc oxide, indium and zinc can improve the migration rate of carriers in the channel layer 300, and further gallium can adjust other parameters of the transistor, such as the threshold voltage of the transistor, so that the transistor can obtain a better comprehensive performance.

In some embodiments, a thickness of the metal oxide semiconductor layer is 0.5 nm to 3 nm.

Because a forming process of the metal oxide semiconductor layer is difficult, the greater the thickness of the metal oxide semiconductor layer, the worse a forming effect and the higher a defect rate. Therefore, the thickness of the metal oxide semiconductor layer is controlled between 0.5 nm and 3 nm in the embodiments, which can reduce the defect rate of the metal oxide semiconductor layer and improve a quality of the metal oxide semiconductor layer, thereby improving its performance. As a result, the reliability of the transistor for long-term use is improved.

In some embodiments, as shown in FIG. 4, the channel layer 300 includes a first sub-channel layer 310 and a second sub-channel layer 320 stacked in sequence. The second sub-channel layer 320 is located between the first sub-channel layer 310 and the gate dielectric layer 220. The first sub-channel layer 310 includes a silicon semiconductor layer or a silicon germanium semiconductor layer, i.e. a material of the first sub-channel layer 310 includes a silicon semiconductor or a silicon germanium semiconductor. The second sub-channel layer 320 includes a metal oxide semiconductor layer, i.e. a material of the second sub-channel layer 320 includes a metal oxide semiconductor.

Exemplarily, the first sub-channel layer 310 may be the substrate 100 located between the first active layer 111 and the second active layer 112, and a material of the substrate 100 includes a silicon semiconductor or a silicon germanium semiconductor. Also exemplarily, the first sub-channel layer 310 may be a doped silicon semiconductor layer or a doped silicon germanium semiconductor layer formed by implanting the doping ions into the substrate 100 located between the first active layer 111 and the second active layer 112. By directly forming the first sub-channel layer 310 in the substrate 100, a manufacturing cycle can be shortened.

In some embodiments, when the first active layer 111 and the second active layer 112 are P-type doped, the first sub-channel layer 310 is N-type doped. When the first active layer 111 and the second active layer 112 are N-type doped, the first sub-channel layer 310 is P-type doped.

In other embodiments, the first sub-channel layer 310 is located between the second sub-channel layer 320 and the gate dielectric layer 220, in terms of the locations of the first sub-channel layer 310 and the second sub-channel layer 320. In this case, the first sub-channel layer 310 may be formed by depositing the silicon semiconductor or the silicon germanium semiconductor on sidewalls and a bottom of the second sub-channel layer 320. The silicon semiconductor may be polysilicon or amorphous silicon, and the polysilicon includes doped polysilicon.

In summary, in the embodiments, when the channel layer 300 of the transistor includes the metal oxide semiconductor layer and the silicon semiconductor layer (or the silicon germanium semiconductor layer), the two sub-channel layers can further increase the migration rate of the carriers in the channel layer 300, and increase the on-current of the channel layer 300, thereby reducing the possibility of leakage of the channel layer, so that the transistor has a faster switching speed.

Figure 6:
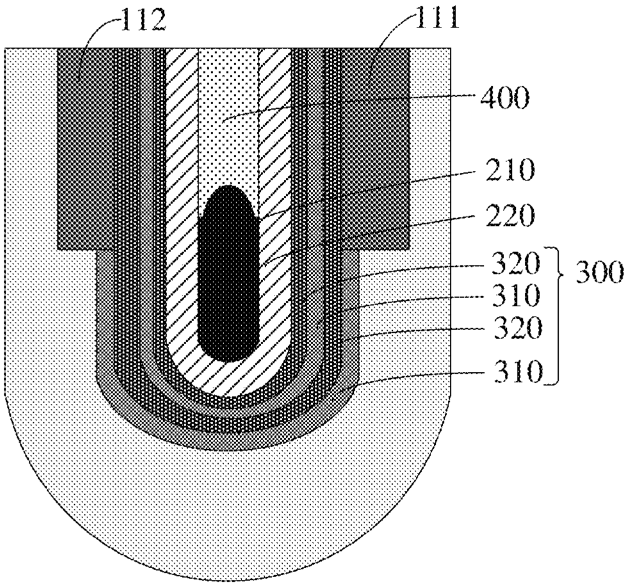
FIG. 6 is a cross-sectional schematic diagram of a transistor provided by embodiments of the disclosure.

In some embodiments, as shown in FIG. 6, the channel layer 300 may include a plurality of sub-channel layer groups, and each sub-channel layer group includes a first sub-channel layer 310 and a second sub-channel layer 320. The material of a first sub-channel layer 310 includes the silicon semiconductor or the silicon germanium semiconductor, and the material of a second sub-channel layer 320 includes the metal oxide semiconductor.

In the embodiments, as shown in FIG. 6, each second sub-channel layer 320 may be stacked on each first sub-channel layer 310. In other embodiments, each first sub-channel layer 310 may be stacked on each second sub-channel layer 320.

In the embodiments, by forming alternate metal oxide semiconductor layers and silicon semiconductor layers (or silicon germanium semiconductor layers), a plurality of metal oxide semiconductor layers can be formed, and a total thickness of the metal oxide semiconductor can be increased, thereby further improving the performance of the transistor.

Moreover, transistors with different performances can be obtained by designing the positions, compositions or shapes of the channel layer 300, the gate dielectric layer 220 and the gate 210. FIG. 7 to FIG. 13 are cross-sectional schematic diagrams of semiconductor structures provided by embodiments of the disclosure. Structures and performances of various semiconductor structures provided by the embodiments of the disclosure will be described in detail below with reference to FIG. 4 and FIG. 7 to FIG. 13.

In some embodiments, as shown in FIG. 4, the metal oxide semiconductor layer (the second sub-channel layer 320) may cover sidewalls of the first active layer 111 and the second active layer 112 which are close to the gate structure 200. A top of the metal oxide semiconductor layer, a top of the first active layer 111 and a top of the second active layer 112 are flush. In this way, a length of the channel can be increased and the migration rate of the carriers can be improved.

In some embodiments, the gate dielectric layer 220 may cover sidewalls and a bottom surface of the metal oxide semiconductor layer, and a top of the gate dielectric layer 220 and the top of metal oxide semiconductor layer are flush.

In some embodiments, the gate 210 includes a first portion 211 and a second portion 212. The first portion 211 is located on a side of the second portion 212 close to a surface of the substrate 100. The first portion 211 has a first dimension along a given direction, and the second portion 212 has a second dimension along the given direction, and the first dimension is less than the second dimension. The given direction is parallel to the surface of the substrate 100 and perpendicular to an extending direction of the gate 210. An X direction in FIG. 4 is the given direction.

A surface of the first portion 211 of the gate 210 may be an arc surface such that a top of a cross section of the gate 210 is Ω-shaped, and the cross section of the gate 210 is perpendicular to the surface of the substrate 100 and perpendicular to the extending direction of the gate 210.

In the embodiments, the first dimension of the first portion 211 of the gate is less than the second dimension of the second portion 212, which can reduce a gate-induced drain leakage (GIDL) current of the transistor. That is, the off-current of the transistor is reduced, thereby increasing a time interval between two adjacent refreshes of the memory and improving the performance of the memory.

In some embodiments, a top of the gate 210 may be lower than the surface of substrate 100, and the transistor further includes a protective layer 400 filled on a side of the gate 210 close to the surface of substrate 100. A top of the protective layer 400 is flush with a top of the gate dielectric layer 220.

A material of the protective layer 400 may include silicon nitride or silicon oxide.

Figure 7:
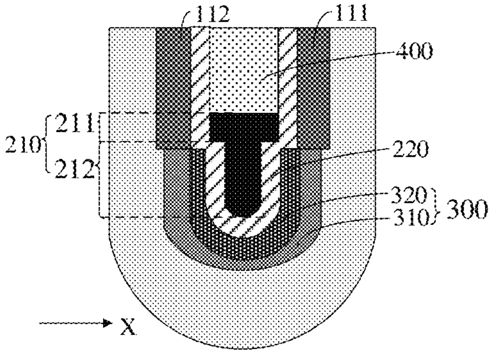
FIG. 7 is a cross-sectional schematic diagram of another transistor provided by embodiments of the disclosure.

In some embodiments, as shown in FIG. 7, a first active layer 111 and a second active layer 112 are located at a top of a channel layer 300.

A gate dielectric layer 220 covers sidewalls of the first active layer 111 and the second active layer 112, and covers the part of the top of the channel layer 300 not covered by the first active layer 111 and the second active layer 112.

Specifically, the channel layer 300 includes a first sub-channel layer 310 (a silicon semiconductor layer or a silicon germanium semiconductor layer) and a second sub-channel layer 320 (a metal oxide semiconductor layer). Tops of the first sub-channel layer 310 and the second sub-channel layer 320 are flush. The first active layer 111 and the second active layer 112 are on the top of first sub-channel layer 310. The gate dielectric layer 220 covers the sidewalls of the first active layer 111 and the second active layer 112, and the top, sidewalls and a bottom of the second sub-channel layer 320.

The channel layer 300 provided in the embodiments can reduce a gate-induced drain leakage current, thereby improving a performance of a memory.

In some embodiments, a first dimension of a first portion 211 may be greater than a second dimension of a second portion 212 of a gate 210, such that a cross section of the gate 210 is T-shaped. In this way, a cross section of a conducting layer of the gate 210 can be increased, and a resistance of the gate 210 is reduced, thereby improving a switching speed of a transistor and improving a reading or writing efficiency of a memory.

Figure 8:
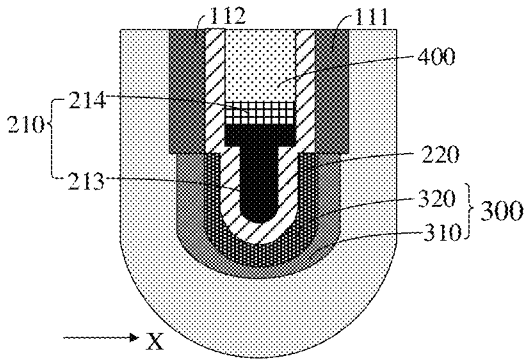
FIG. 8 is a cross-sectional schematic diagram of still another transistor provided by embodiments of the disclosure.
Figure 9:
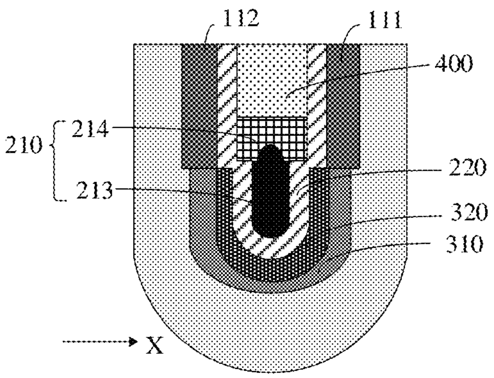
FIG. 9 is a cross-sectional schematic diagram of still another transistor provided by embodiments of the disclosure.

In some embodiments, a structure of a transistor can also be as shown in FIG. 8 and FIG. 9, and structures of a channel layer 300 and a gate dielectric layer 220 of the transistor are the same as those of the transistor shown in FIG. 7.

In addition, a gate 210 of the transistor includes a first sub-gate 213 and a second sub-gate 214. The second sub-gate 214 is located on a side of the first sub-gate 213 close to a surface of a substrate 100. A material of the first sub-gate 213 includes a metal, and a material of the second sub-gate 214 includes polysilicon.

In some embodiments, the material of the second sub-gate 214 may also be doped polysilicon.

In some embodiments, a structure of the first sub-gate 213 may have a T-shaped cross section (as shown in FIG. 8), or have a cross section with an Ω-shaped top (as shown in FIG. 9).

Exemplarily, the second sub-gate 214 has a third dimension along a given direction (an X direction). The third dimension is equal to or greater than a first dimension and a second dimension of the first sub-gate 213. Specifically, in FIG. 8, the third dimension of the second sub-gate 214 is equal to the first dimension of a first portion 211 of the first sub-gate 213 and greater than the second dimension of a second portion 212. In FIG. 9, the third dimension of the second sub-gate 214 is greater than the first dimension of a first portion 211 and the second dimension of a second portion 212 of the first sub-gate 213.

In the embodiments, by using a composite gate structure formed by the first sub-gate 213 and the second sub-gate 214, a gate-induced drain leakage current can be reduced, thereby improving a performance of a memory.

In some embodiments, a structure of a transistor can be as shown in FIG. 10 to FIG. 13. A second sub-channel layer 320 (a metal oxide semiconductor layer) covers sidewalls of a first active layer 111 and a second active layer 112 which are close to a gate structure 200. A top of the second sub-channel layer 320 and tops of the first active layer 111 and the second active layer 112 are flush. A gate dielectric layer 220 covers a bottom surface and part of sidewalls of the second sub-channel layer 320. A top of the gate dielectric layer 220 is lower than the top of second sub-channel layer 320. The second sub-channel layer 320 and the gate dielectric layer 220 provided in the embodiments can reduce a gate-induced drain leakage current, thereby improving a performance of a memory.

Figure 10:
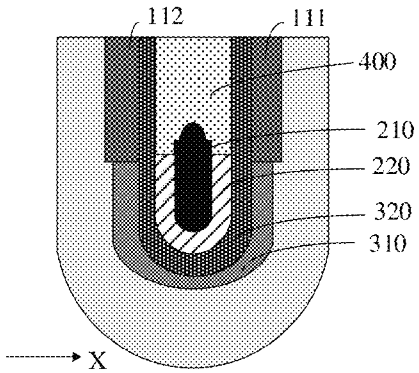
FIG. 10 is a cross-sectional schematic diagram of still another transistor provided by embodiments of the disclosure.

In some embodiments, a structure of a gate 210 may be as shown in FIG. 10. A top of a cross section of the gate 210 is Ω-shaped, thereby further reducing the gate-induced drain leakage current.

Figure 11:
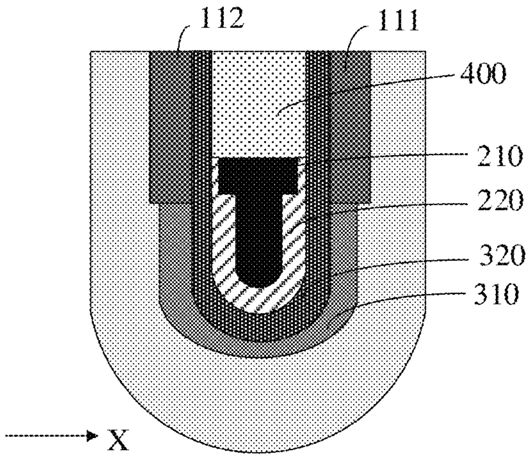
FIG. 11 is a cross-sectional schematic diagram of still another transistor provided by embodiments of the disclosure.

A structure of a gate 210 may be as shown in FIG. 11. A cross section of the gate 210 is T-shaped, so that a cross section of a conducting layer of the gate 210 can be increased, and a resistance of the gate 210 is reduced, thereby improving a switching speed of the transistor.

Figure 12:
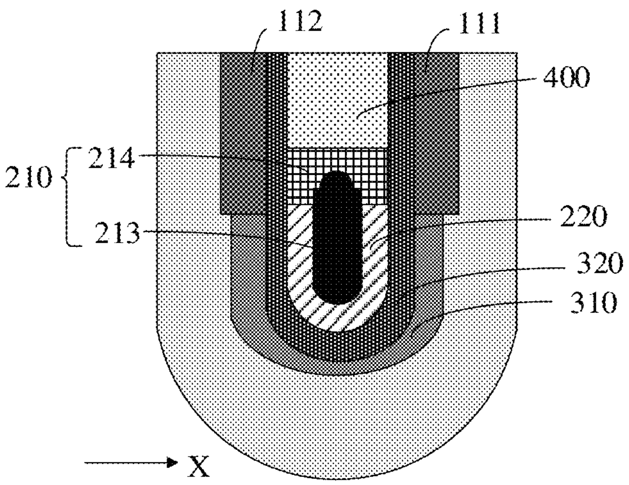
FIG. 12 is a cross-sectional schematic diagram of still another transistor provided by embodiments of the disclosure.

A structure of a gate 210 may be as shown in FIG. 12. The gate 210 includes a first sub-gate 213 and a second sub-gate 214. A top of a cross section of the first sub-gate 213 is Ω-shaped.

Figure 13:
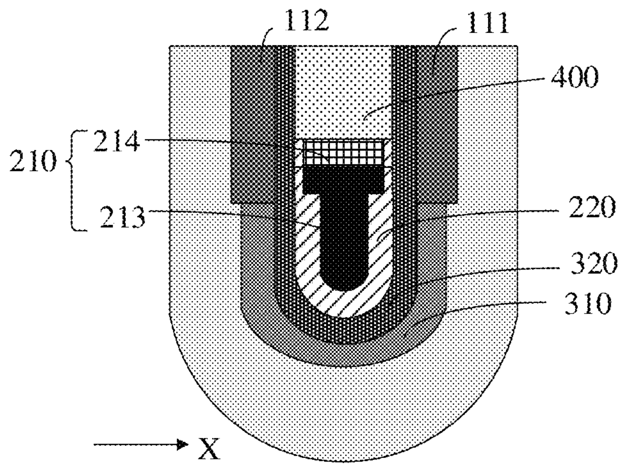
FIG. 13 is a cross-sectional schematic diagram of still another transistor provided by embodiments of the disclosure.

A structure of a gate 210 may be as shown in FIG. 13. The gate 210 includes a first sub-gate 213 and a second sub-gate 214. A cross section of the first sub-gate 213 is T-shaped. In FIG. 12 and FIG. 13, a composite gate structure formed by the first sub-gate 213 and the second sub-gate 214 can further reduce the gate-induced drain leakage current.

To sum up, in the embodiments of the disclosure, the transistors with different performances can be obtained by designing the positions, compositions or shapes of the channel layer, the gate dielectric layer and the gate, thereby obtaining the memories with different performances. Exemplarily, the transistors with the faster switching speed can be obtained so as to obtain the memories with the higher reading or writing speed or the transistors with the smaller off-current, thereby obtaining memories with the longer time interval between refreshes.

Figure 14:
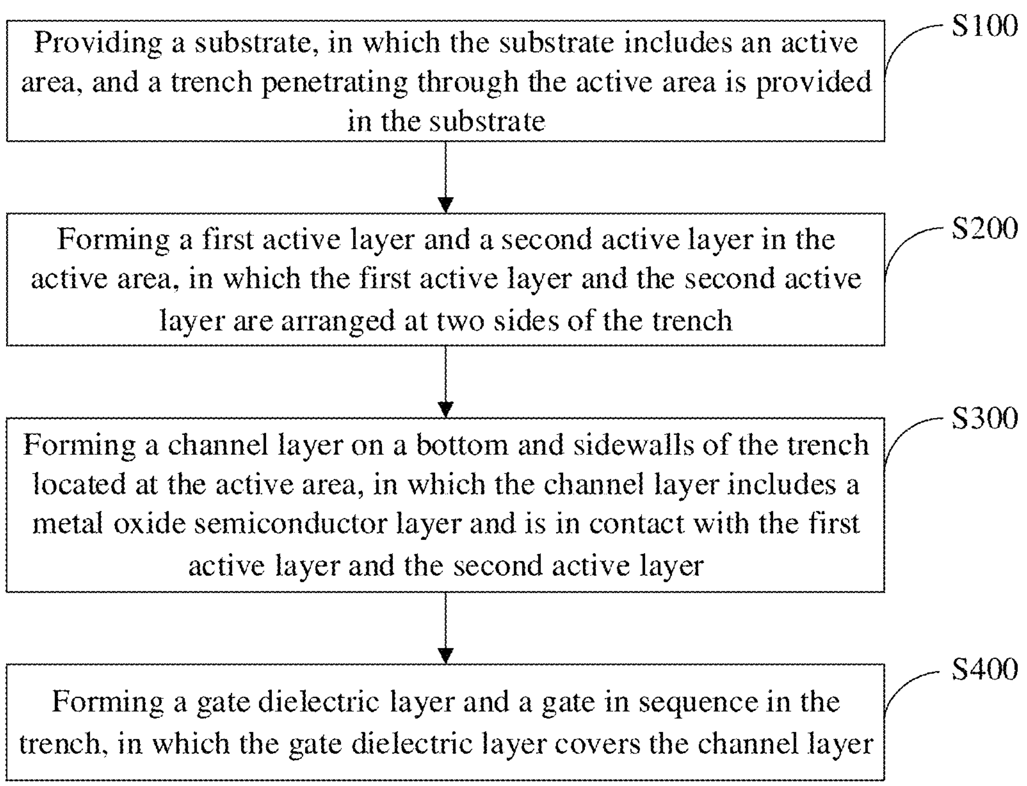
FIG. 14 is a schematic flowchart of a method of manufacturing a transistor array provided by embodiments of the disclosure.

Embodiments of the disclosure also provide a method for manufacturing a transistor. FIG. 14 is a flowchart of the method for manufacturing a transistor provided by the embodiments of the disclosure. As shown in FIG. 14, the method includes the following operations.

At S100, a substrate 100 is provided. Herein, the substrate includes an active area 110, and a trench penetrating through the active area 110 is provided in the substrate.

At S200, a first active layer 111 and a second active layer 112 are formed in the active area 110. Herein, the first active layer 111 and the second active layer 112 are arranged at two sides of the trench.

At S300, a channel layer 300 is formed on a bottom and sidewalls of the trench located at the active area 110. Herein, the channel layer 300 includes a metal oxide semiconductor layer and is in contact with the first active layer 111 and the second active layer 112.

At S400, a gate dielectric layer 220 and a gate 210 are formed in the trench in sequence. Herein, the gate dielectric layer 220 covers the channel layer 300.

It should be understood that, the operations shown in S100 to S400 are not necessarily performed in an exact order. On the contrary, the operations may be performed in any order or simultaneously. In addition, other operations can also be added to these operations.

FIG. 15A to FIG. 15E are schematic structural diagrams of a transistor array provided by embodiments of the disclosure during its manufacturing process. A method for manufacturing a transistor provided by the embodiments of the disclosure will be described in detail below with reference to FIG. 3 and FIG. 15A to FIG. 15E. It should be noted that, FIG. 15A to FIG. 15E are sectional view of the transistor array along the A-A line.

Figure 15A:
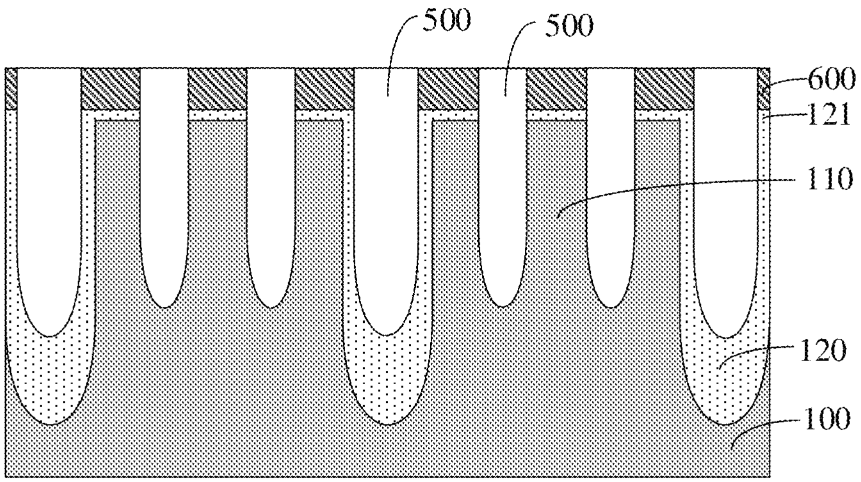
FIG. 15A is a first schematic structural diagram of a transistor array provided by embodiments of the disclosure during its manufacturing process.

Referring to FIG. 3 and FIG. 15A, S100 is performed to provide a substrate 100. The substrate includes an active area 110, and a trench 500 penetrating through the active area 110 is provided in the substrate.

In some embodiments, a material of the substrate 100 may include silicon (Si), germanium (Ge), silicon-on-insulator (SOI), germanium-on-insulator (GOI), or a silicon germanium semiconductor, etc.

The substrate 100 includes a plurality of active areas 110 arranged in an array, and shallow trench isolation structures 120 located between adjacent active areas 110. Each trench 500 penetrates through a plurality of active areas 110 arranged in parallel, and through shallow trench isolation structures 120 between the active areas 110. Therefore, it can be understood that, in FIG. 15A, the trench 500 is also formed in a shallow trench isolation structure 120. In subsequent operations, although a gate 210 and a gate dielectric layer 220 are formed in the trench 500 formed in the shallow trench isolation structure 120, a first active layer 111 and a second active layer 112 are not formed at two sides of the gate dielectric layer 220. As a result, a transistor is not formed in the shallow trench isolation structure 120.

In some embodiments, one active area 110 may be penetrated through by two trenches 500 arranged in parallel in order to form two transistors in the one active area 110.

In some embodiments, a material of the shallow trench isolation structure 120 may include silicon oxide.

In some embodiments, a depth of the part of the trench 500 located in the substrate 100 is different from a depth of the part of the trench 500 located in the shallow trench isolation structure 120. This is because materials of the substrate 100 and the shallow trench isolation structure 120 are different, and etching rates of the substrate 100 and the shallow trench isolation structure 120 are different under the same etching conditions. Therefore, the depth of the part of the trench 500 located in the substrate 100 is different from the depth of the part of the trench located in the shallow trench isolation structure 120. The depth of the part of the trench 500 located in the substrate 100 may be less than or greater than the depth of the part of the trench 500 located in the shallow trench isolation structure 120, which depends on the materials of the substrate 100 and the shallow trench isolation structure 120, and etching conditions.

In some embodiments, as shown in FIG. 15A, an insulating layer 121 and a mask layer 600 are stacked on the substrate 100 in sequence. In some embodiments, a material of the insulating layer 121 may be the same as the material of shallow trench isolation structure 120, for example, silicon oxide. The insulating layer 121 and the shallow trench isolation structure 120 may be formed in the same operation. A material of the mask layer 600 may include silicon nitride.

In the embodiments, a plurality of trenches 500 also penetrate through the mask layer 600 and the insulating layer 121, and extend into the substrate 100 or the shallow trench isolation structures 120.

Figure 15B:
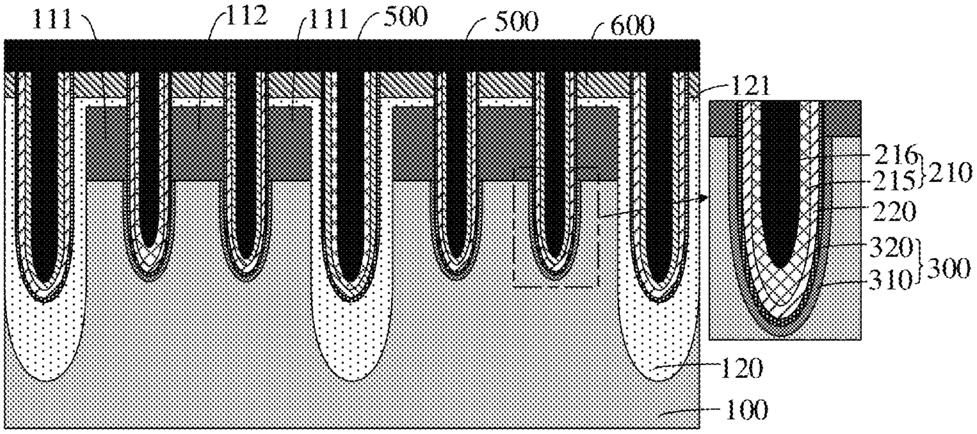
FIG. 15B is a second schematic structural diagram of a transistor array provided by embodiments of the disclosure during its manufacturing process.

Referring to FIG. 15B, S200 is performed. First doping ions are implanted into a first region and a third region of the active area 110 to form a first active layer 111 of a first transistor and a first active layer 111 of a second transistor. Second doping ions are implanted into a second region of the active area 110 to form a second active layer 112 of the first transistor and a second active layer 112 of the second transistor.

In some embodiments, the first doping ions may include a P-type doping ion (for example, boron, aluminum or gallium), or an N-type doping ion (for example, phosphorus, arsenic or antimony). The second doping ions may also include the P-type doping ion (for example, boron, aluminum or gallium), or the N-type doping ion (for example, phosphorus, arsenic or antimony). The first doping ions and the second doping ions may be the P-type doping ion or the N-type doping ion. Element types of the first doping ions and the second doping ions may be the same.

Referring to FIG. 15B, S300 and S400 are performed. A channel layer 300 is formed on a bottom and sidewalls of the trench 500 located at the active area 110. A gate dielectric layer 220 and a gate 210 are formed in the trench 500 in sequence.

In some embodiments, the channel layer 300 includes a first sub-channel layer 310 and a second sub-channel layer 320 stacked in sequence. A material of the first sub-channel layer 310 includes a silicon semiconductor or a silicon germanium semiconductor. A material of the second sub-channel layer 320 includes a metal oxide semiconductor.

Firstly, third doping ions are implanted into the substrate 100 located between the first active layer 111 and the second active layer 112 to form the first sub-channel layer 310.

The third doping ions may include the P-type doping ion (for example, boron, aluminum or gallium), or the N-type doping ion (for example, phosphorus, arsenic or antimony). It can be understood that, when the first active layer 111 and the second active layer 112 are N-type doped, the first sub-channel layer 310 is P-type doped. When the first active layer 111 and the second active layer 112 are P-type doped, the first sub-channel layer 310 is N-type doped.

It should be noted that, in the manufacturing process of the transistors, S200 may be performed first to form the first active layers 111 and the second active layers 112 by implanting the first doping ions and the second doping ions into the active area 110. Then, S300 is performed to form the first sub-channel layer 310 by implanting the third doping ions into the active area 110. Alternatively, S300 may be performed first, and after a first sub-channel layer 310 is formed by doping, first active layers 111 and second active layers 112 are formed by doping. This is not limited in the disclosure.

In addition, S400 may be performed before S200 and S300, after S200 and S300, or between S200 and S300. This is not limited in the disclosure. In some embodiments, S200 and S300 are performed first, and then S400 is performed. That is, after the first active layers 111, the second active layers 112 and the first sub-channel layer 310 are formed, the gate 210 is formed. In this way, an impact of implanting ions on the gate 210 can be avoided.

Still referring to FIG. 15B, a second sub-channel layer 320 covering sidewalls and a bottom of the trench 500 is formed. The second sub-channel layer 320 includes a metal oxide semiconductor layer.

In some embodiments, the metal oxide semiconductor layer may include at least one of indium gallium zinc oxide, indium tin oxide, indium tungsten oxide, indium zinc oxide, gallium oxide or indium oxide. In some embodiments, a thickness of the metal oxide semiconductor layer may be 0.5 nm to 3 nm.

In some embodiments, since the first sub-channel layer 310 is located in the trench 500 close to the substrate 100, the second sub-channel layer 320 also covers a bottom and sidewalls of the first sub-channel layer 310.

It should be noted that, in some embodiments, only the second sub-channel layer 320 may be provided, without providing the first sub-channel layer 310.

In addition, it should be noted that, in the embodiments, the second sub-channel layers 320 is located in the trench 500 of the active area 110 and also in the trench 500 of the shallow trench isolation structure 120. That is, the second sub-channel layer 320 is located on the sidewalls and the bottom of the whole trench 500. A process for disposing the second sub-channel layer 320 in this way is relatively simple.

In some embodiments, a second sub-channel layer 320 may be formed only in the trench 500 of the active area 110, while the second sub-channel layer 320 may not be disposed in the trench 500 of the shallow trench isolation structure 120. Specifically, a second sub-channel material layer located in the shallow trench isolation structure 120 may be removed by etching, and only the second sub-channel material layer located on the sidewalls and the bottom of the trench 500 of the active area 110 is remained to form the second sub-channel layer 320. In this way, interference between adjacent transistors can be reduced.

In some embodiments, forming the second sub-channel layer 320 covering the sidewalls and the bottom of the trench 500 includes the following operations. A second sub-channel material layer covering the sidewalls and the bottom of the trench 500 and a surface of the mask layer 600 is formed. The second sub-channel material layer on the surface of the mask layer 600 is removed by chemical mechanical polishing (CMP), such that only the second sub-channel material layer on the sidewalls and the bottom of the trench 500 is remained to form the second sub-channel layer 320.

Still referring to FIG. 15B, a gate dielectric layer 220 covering sidewalls and a bottom of the second sub-channel layer 320 is formed. Finally, a gate material layer covering sidewalls and a bottom of the gate dielectric layer 220, and covering the surface of mask layer 600 is formed. The gate material layer fills up a remaining interspace in the trench 500.

In some embodiments, forming the gate dielectric layer 220 covering the sidewalls and the bottom of the second sub-channel layer 320 includes the following operations. A gate dielectric material layer covering the sidewalls and the bottom of the second sub-channel layer 320 and the surface of the mask layer 600 is formed. The gate dielectric material layer on the surface of mask layer 600 is removed by chemical mechanical polishing, such that only the gate dielectric material layer covering the sidewalls and the bottom of the second sub-channel layer 320 is remained to form the gate dielectric layer 220.

In some embodiments, the gate material layer includes a third sub-gate material layer and a fourth sub-gate material layer. Forming the gate material layer includes the following operations. A third sub-gate material layer covering sidewalls and a bottom of the gate dielectric layer 220 is formed. A fourth sub-gate material layer covering sidewalls and a bottom of the third sub-gate material layer and the surface of the mask layer 600 is formed. Herein, the fourth sub-gate material layer fills up the remaining interspace in the trench 500.

In some embodiments, a material of the third sub-gate material layer includes a metallic nitride, for example, titanium nitride, tantalum nitride, tungsten nitride, or the like. A material of the fourth sub-gate material layer includes a metal, for example, tantalum, titanium, molybdenum, tungsten, platinum, aluminum, hafnium, ruthenium, cobalt, or the like.

Figure 15C:
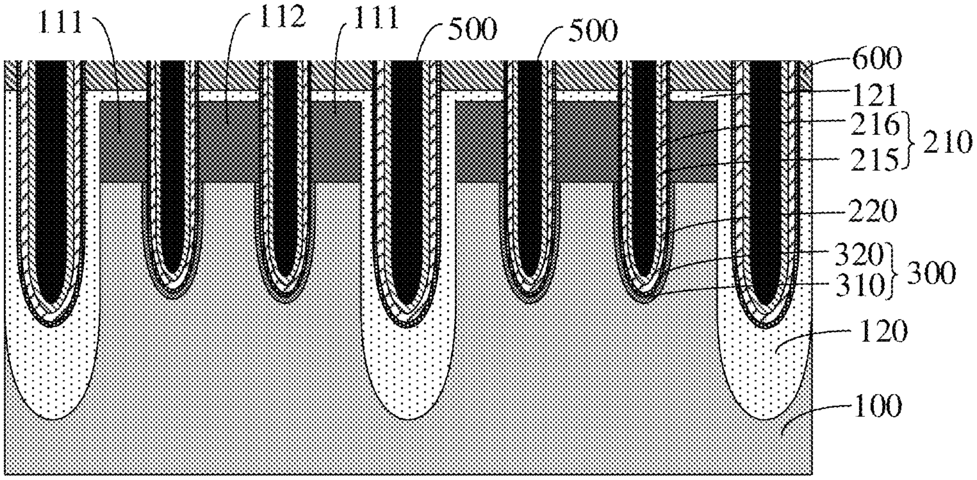
FIG. 15C is a third schematic structural diagram of a transistor array provided by embodiments of the disclosure during its manufacturing process.

Referring to FIG. 15C, the fourth sub-gate material layer located on the surface of the mask layer 600 is removed. In some embodiments, the fourth sub-gate material layer located on the surface of the mask layer 600 may be removed by adopting a process of chemical mechanical polishing, such that only the fourth sub-gate material layer in the trench 500 is remained.

Figure 15D:
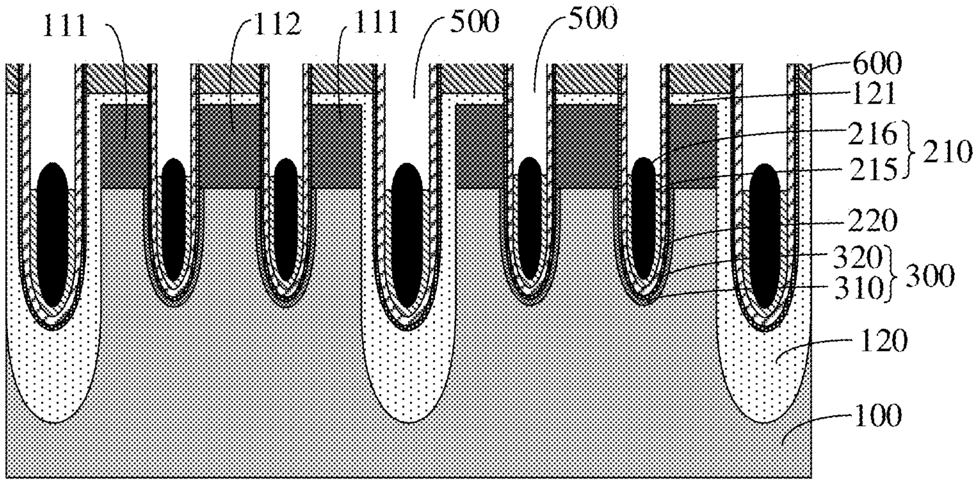
FIG. 15D is a fourth schematic structural diagram of a transistor array provided by embodiments of the disclosure during its manufacturing process.

Referring to FIG. 15D, part of the third sub-gate material layer located on the sidewalls of the gate dielectric layer 220 is removed by etching, such that a remaining third sub-gate material layer forms a third sub-gate 215.

Part of the fourth sub-gate material layer is removed by etching, such that a remaining fourth sub-gate material layer forms a fourth sub-gate 216. Herein, a top of the fourth sub-gate 216 may be higher than or flush with a top of the third sub-gate 215. The third sub-gate 215 and the fourth sub-gate 216 constitute the gate 210 in the embodiments.

In some embodiments, the third sub-gate material layer may be etched first, and then the fourth sub-gate material layer may be etched. It is also possible to etch the fourth sub-gate material layer first, and then etch the third sub-gate material layer. This is not limited in the disclosure.

Figure 15E:
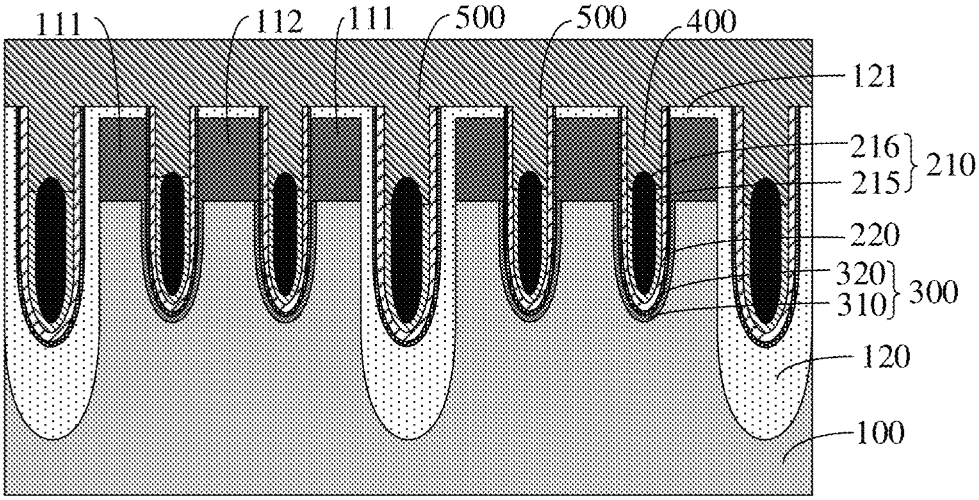
FIG. 15E is a fifth schematic structural diagram of a transistor array provided by embodiments of the disclosure during its manufacturing process.

Referring to FIG. 15E, the mask layer 600, and the second sub-channel layer 320 and the gate dielectric layer 220 which are on the mask layer are removed. A protective layer 400 filling up a remaining interspace in the trench 500 and covering a surface of the insulating layer 121 is formed.

In some embodiments, a material of the protective layer 400 may include silicon oxide or silicon nitride.

In addition, in some embodiments, in order to obtain a transistor shown in FIG. 7, the manufacturing method includes the following operation.

After forming the second sub-channel material layer covering the sidewalls and the bottom of the trench 500, part of the second sub-channel material layer located on the sidewalls of the trench 500 is removed by etching. A remaining second sub-channel material layer forms a second sub-channel layer 320. Herein, a top of the second sub-channel layer 320 is flush with a top of a first sub-channel layer 310, and they are lower than the surface of substrate 100.

When forming a gate dielectric layer 220, the gate dielectric layer 220 covers a surface of the trench 500 that is not covered by the second sub-channel layer 320, and covers the top, sidewalls and a bottom of the second sub-channel layer 320.

In the embodiments, the surface of the trench 500 that is not covered by the second sub-channel layer 320 includes sidewalls of a first active layer 111 and a second active layer 112.

In some embodiments, in order to form the gate 210 of the transistor shown in FIG. 8, S400 further includes the following operations.

A first sub-gate 213 is formed on a side of the gate dielectric layer 220 away from the channel layer 300. Herein, a material of the first sub-gate 213 includes a metal.

A second sub-gate 214 is formed on a top of the first sub-gate 213. Herein, a material of the second sub-gate 214 includes polysilicon.

Specifically, after forming the gate dielectric layer 220, a first sub-gate material layer filling a remaining interspace in the trench 500 is formed. Part of the first sub-gate material layer is removed by etching, such that a remaining first sub-gate material forms the first sub-gate 213. A second sub-gate material is formed on the top of first sub-gate 213 in the trench 500. Part of the second sub-gate material is removed, such that a remaining second sub-gate material forms the second sub-gate 214.

In some embodiments, in order to form a transistor shown in FIG. 10, the manufacturing method further includes the following operations.

After forming the gate dielectric material layer on the second sub-channel layer 320, part of the gate dielectric material layer located at sidewalls of the second sub-channel layer 320 is removed, and a remaining gate dielectric material layer forms a gate dielectric layer 220.

After that, a gate and a protective layer 400 are formed in the trench 500.

Embodiments of the disclosure further provide a memory including a storage unit. The storage unit is configured to store data and includes anyone of the above transistors.

In some embodiments, the storage unit further includes a capacitor. The capacitor is coupled to a first active layer 111 or a second active layer 112 of the transistor of the storage unit.

In some embodiments, the transistor can also be applied to a peripheral circuit of the memory. The transistor can be coupled to the storage unit and configured to control an operation of the storage unit.

Figure 16:
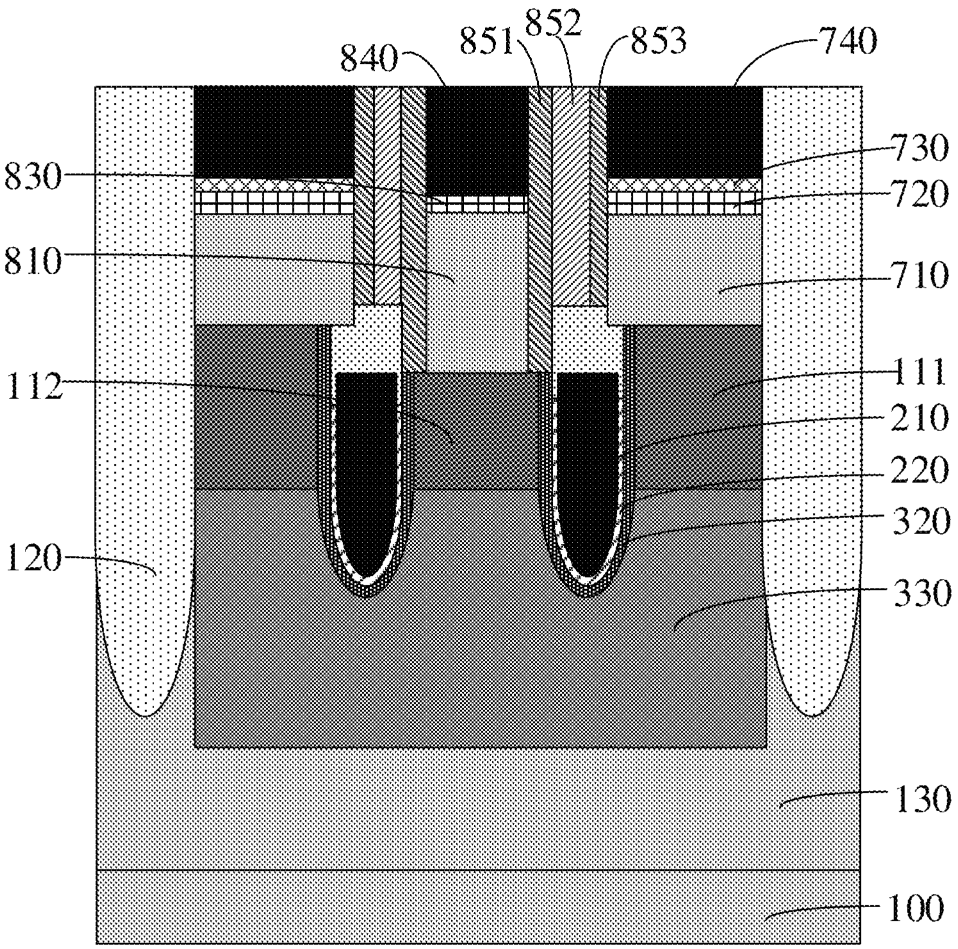
FIG. 16 is a cross-sectional schematic diagram of still another transistor provided by embodiments of the disclosure.

FIG. 16 is a schematic structural diagram of a transistor applied to a storage unit and provided by embodiments of the disclosure. As shown in FIG. 16, the transistor may further include a deep well region 130, a first contact structure 710, an adhesion layer 720, a first barrier layer 730, a first contact pad 740, a second contact structure 810, a second barrier layer 830, a second contact pad 840 and an isolation structure.

The deep well region 130 is located on a side of a well region 330 away from a second sub-channel layer 320.

The first contact structure 710, the adhesion layer 720, the first barrier layer 730, and the first contact pad 740 are stacked on a first active layer 111 in sequence.

The second contact structure 810, the second barrier layer 830 and the second contact pad 840 are stacked on a second active layer 112 in sequence.

The isolation structure is located on a protective layer 400, and includes a first sub-isolation structure 851, a second sub-isolation structure 852 and a third sub-isolation structure 853 stacked in sequence along a given direction (an X direction).

In some embodiments, a region of the well region 330 close to a gate 210 may function as a first sub-channel layer.

The deep well region 130 is used for isolating the transistor from other structures. Doping ions of the deep well region 130 may include a P-type doping ion (for example, boron, aluminum or gallium), or an N-type doping ion (for example, phosphorus, arsenic or antimony). When the well region 330 is P-type doped, the deep well region 130 is N-type doped, or when the well region 330 is N-type doped, the deep well region 130 is P-type doped.

A substrate 100 may include an N-type semiconductor.

A material of the first contact structure 710 and the second contact structure 810 may include polysilicon.

A material of the adhesion layer 720 may include a metal silicide, for example, titanium silicide, cobalt silicide, nickel silicide, tantalum silicide or the like. The adhesion layer 720 is used for reducing a contact resistance.

A material of the first barrier layer 730 and the second barrier layer 830 may include a metal nitride, for example, titanium nitride, tantalum nitride, tungsten nitride, or the like. The first barrier layer 730 and the second barrier layer 830 are used for preventing a metal from diffusing. Element types of the first barrier layer 730 and the second barrier layer 830 may be the same.

A material of the first sub-isolation structure 851, the second sub-isolation structure 852 and the third sub-isolation structure 853 may include silicon oxide or silicon nitride. Herein, materials of the first sub-isolation structure 851 and the third sub-isolation structure 853 may be the same.

A material of the first contact pad 740 and the second contact pad 840 may include a metal, for example, tantalum, titanium, molybdenum, tungsten, platinum, aluminum, hafnium, ruthenium, cobalt, or the like. Element types of the first contact pad 740 and the second contact pad 840 may be the same.

In some embodiments, the first contact pad 740 is used for connecting a capacitor and the second contact pad 840 is used for connect a bit line. A transistor array provided in the embodiment, together with capacitors and bit lines, form a storage unit array of a memory. Herein, the memory is a DRAM.

The above embodiments only illustrate the principle and efficacy of the disclosure, and are not intended to limit the disclosure. Anyone skilled in the art can make modifications or changes to the above embodiments without departing from the spirit and scope of the disclosure. Therefore, all equivalent modifications or changes made by one person with common knowledge in the technical field without departing from the spirit and technical idea disclosed by the disclosure should still be covered by the claims of the disclosure.

What is claimed is:

1. A transistor, comprising:

a substrate comprising an active area;

a gate structure penetrating through the active area and comprising a gate and a gate dielectric layer, the gate dielectric layer covering sidewalls and a bottom of the gate;

a channel layer located on a side of the gate dielectric layer away from the gate, the channel layer comprising a metal oxide semiconductor layer;

wherein the active area comprises a first active layer and a second active layer located at two sides of the gate structure, and the first active layer and the second active layer are in contact with the channel layer;

wherein the first active layer and the second active layer are located on a top of the channel layer, and the gate dielectric layer covers sidewalls of the first active layer and the second active layer, and part of the top of the channel layer not covered by the first active layer and the second active layer.

2. The transistor according to claim 1, wherein a material of the metal oxide semiconductor layer comprises at least one of indium gallium zinc oxide, indium tin oxide, indium tungsten oxide, indium zinc oxide, gallium oxide or indium oxide.

3. The transistor according to claim 1, wherein a thickness of the metal oxide semiconductor layer is 0.5 nm to 3 nm.

4. The transistor according to claim 1, wherein the channel layer comprises at least one sub-channel layer group, and the sub-channel layer group comprises two sub-channel layers stacked in sequence, and one of the two sub-channel layers comprises the metal oxide semiconductor layer and another of the two sub-channel layers comprises a silicon germanium semiconductor layer or a silicon semiconductor layer.

5. The transistor according to claim 1, wherein the metal oxide semiconductor layer covers sidewalls of the first active layer and the second active layer close to the gate structure.

6. The transistor according to claim 1, wherein the gate comprises a first portion and a second portion, and the first portion is located on a side of the second portion close to a surface of the substrate, and the first portion has a first dimension along a given direction, and the second portion has a second dimension along the given direction, and the first dimension is greater than the second dimension, and the given direction is parallel to the surface of the substrate and perpendicular to an extending direction of the gate.

7. The transistor according to claim 1, wherein the gate comprises a first sub-gate and a second sub-gate, and the second sub-gate is located on a side of the first sub-gate close to a surface of the substrate, and a material of the first sub-gate comprises a metal, and a material of the second sub-gate comprises polysilicon.

8. The transistor according to claim 7, wherein a top of a cross section of the first sub-gate is Q-shaped.

9. The transistor according to claim 7, wherein a third dimension of the second sub-gate is equal to a first dimension of a first portion of the first sub-gate and greater than a second dimension of a second portion, the first portion is located on a side of the second portion close to the surface of the substrate, and the first dimension, the second dimension and the third dimension are along a direction parallel to the surface of the substrate and perpendicular to an extending direction of the gate.

10. The transistor according to claim 7, wherein a cross section of the first sub-gate is T-shaped.

11. A memory comprising a storage unit, wherein the storage unit is configured to store data and comprises the transistor according to claim 1.

12. The memory according to claim 11, wherein the storage unit further comprises:

a capacitor coupled to the first active layer or the second active layer of the transistor in the storage unit.

13. A method for manufacturing a transistor, comprising:

providing a substrate, wherein the substrate comprises an active area, and a trench penetrating through the active area is provided in the substrate;

forming a first active layer and a second active layer in the active area, wherein the first active layer and the second active layer are respectively arranged at two sides of the trench;

forming a channel layer on a bottom and sidewalls of the trench located at the active area, wherein the channel layer comprises a metal oxide semiconductor layer and is in contact with the first active layer and the second active layer; and forming a gate dielectric layer and a gate in sequence in the trench, wherein the gate dielectric layer covers the channel layer;

wherein the channel layer comprises a first sub-channel layer and a second sub-channel layer stacked in sequence; and the forming the channel layer on the bottom and sidewalls of the trench located at the active area comprises:

implanting doping ions into the bottom and the sidewalls of the trench located at the active area to form the first sub-channel layer; and forming the second sub-channel layer covering a bottom and sidewalls of the first sub-channel layer, wherein the second sub-channel layer comprises the metal oxide semiconductor layer;

wherein the first active layer and the second active layer are located on a top of the first sub-channel layer, and a top of the second sub-channel layer and a top of the first sub-channel layer are flush, and wherein the forming the gate dielectric layer in the trench comprises:

forming the gate dielectric layer in the trench, wherein the gate dielectric layer covers the top of the second sub-channel layer and sidewalls of the first active layer and the second active layer.

14. The method according to claim 13, wherein a material of the metal oxide semiconductor layer comprises at least one of indium gallium zinc oxide, indium tin oxide, indium tungsten oxide, indium zinc oxide, gallium oxide or indium oxide.

15. The method according to claim 13, wherein a thickness of the metal oxide semiconductor layer is 0.5 nm to 3 nm.

16. The method according to claim 13, wherein the first active layer and the second active layer are located on a top of the first sub-channel layer, and the second sub-channel layer also covers sidewalls of the first active layer and the second active layer close to the gate; and the forming the second sub-channel layer covering the bottom and sidewalls of the first sub-channel layer comprises:

forming the second sub-channel layer covering the bottom and the sidewalls of the trench; wherein a top of the second sub-channel layer, a top of the first active layer and a top of the second active layer are flush.

17. The method according to claim 13, wherein the first active layer and the second active layer are located on a top of the first sub-channel layer, and a top of the second sub-channel layer and a top of the first sub-channel layer are flush, and wherein the forming the gate dielectric layer in the trench comprises:

forming the gate dielectric layer in the trench, wherein the gate dielectric layer covers the top of the second sub-channel layer and sidewalls of the first active layer and the second active layer.

18. The method according to claim 13, wherein the gate comprises a first sub-gate and a second sub-gate, and the second sub-gate is located on a side of the first sub-gate close to a surface of the substrate, and wherein the forming the gate in the trench comprises:

forming the first sub-gate on a side of the gate dielectric layer away from the channel layer, wherein a material of the first sub-gate comprises a metal; and forming the second sub-gate on a top of the first sub-gate; wherein a material of the second sub-gate comprises polysilicon.

* * * * *